(12) United States Patent
Richter et al.

(10) Patent No.: US 8,951,907 B2
(45) Date of Patent: Feb. 10, 2015

(54) SEMICONDUCTOR DEVICES HAVING THROUGH-CONTACTS AND RELATED FABRICATION METHODS

(75) Inventors: Ralf Richter, Dresden (DE); Jens Heinrich, Wachau (DE); Holger Schuehrer, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 151 days.

(21) Appl. No.: 12/968,068

(22) Filed: Dec. 14, 2010

(65) Prior Publication Data

US 2012/0146106 A1 Jun. 14, 2012

(51) Int. Cl.
| H01L 21/4763 | (2006.01) |
| H01L 21/768 | (2006.01) |
| H01L 21/285 | (2006.01) |
| H01L 23/485 | (2006.01) |

(52) U.S. Cl.
CPC .... *H01L 21/76808* (2013.01); *H01L 21/28512* (2013.01); *H01L 23/485* (2013.01); *H01L 21/76802* (2013.01)
USPC ............... 438/626; 438/586; 257/E21.577

(58) Field of Classification Search
CPC ............... H01L 21/76802; H01L 21/76808
USPC ............... 257/586, 622, 624, 625, 626, 629, 257/E21.577; 438/626, 586
See application file for complete search history.

(56) References Cited

U.S. PATENT DOCUMENTS

| 6,080,661 | A | * | 6/2000 | Bothra | 438/637 |
| 6,287,961 | B1 | * | 9/2001 | Liu et al. | 438/638 |
| 6,300,201 | B1 | * | 10/2001 | Shao et al. | 438/281 |
| 6,417,572 | B1 | | 7/2002 | Chidambarrao et al. | |
| 6,451,708 | B1 | * | 9/2002 | Ha | 438/738 |

(Continued)

FOREIGN PATENT DOCUMENTS

| CN | 101626022 A | 1/2010 |
| DE | 102007057682 A1 | 6/2009 |
| KR | 1019990023220 A | 3/1999 |

OTHER PUBLICATIONS

Hu et al., "Self-Organized Nanomolecular Films on Low-Dielectric Constant Porous Methy Silsesquioxane at Room Temperature," Feb. 25, 2003, Journal of the Electrochemical Society, 150 (4), F61-F66.*

(Continued)

*Primary Examiner* — Joseph C Nicely
(74) *Attorney, Agent, or Firm* — Ingrassia Fisher & Lorenz, P.C.

(57) ABSTRACT

Apparatus for semiconductor device structures and related fabrication methods are provided. One method for fabricating a semiconductor device structure involves forming a layer of dielectric material overlying a doped region formed in a semiconductor substrate adjacent to a gate structure and forming a conductive contact in the layer of dielectric material. The conductive contact overlies and electrically connects to the doped region. The method continues by forming a second layer of dielectric material overlying the conductive contact, forming a voided region in the second layer overlying the conductive contact, forming a third layer of dielectric material overlying the voided region, and forming another voided region in the third layer overlying at least a portion of the voided region in the second layer. The method continues by forming a conductive material that fills both voided regions to contact the conductive contact.

18 Claims, 5 Drawing Sheets

(56) References Cited

U.S. PATENT DOCUMENTS

| | | | |
|---|---|---|---|
| 6,465,294 B1* | 10/2002 | Tsai et al. | 438/217 |
| 6,479,380 B2* | 11/2002 | Furusawa et al. | 438/638 |
| 6,627,528 B1* | 9/2003 | Ishimaru | 438/596 |
| 6,673,718 B1 | 1/2004 | Lee et al. | |
| 6,699,746 B2* | 3/2004 | Chung et al. | 438/239 |
| 6,743,712 B2* | 6/2004 | Park et al. | 438/637 |
| 6,794,693 B2* | 9/2004 | Kakamu et al. | 257/257 |
| 7,115,491 B2* | 10/2006 | Huang et al. | 438/586 |
| 7,119,013 B2* | 10/2006 | Lee et al. | 438/666 |
| 7,365,009 B2* | 4/2008 | Chou et al. | 438/675 |
| 2001/0000155 A1* | 4/2001 | Huang et al. | 438/597 |
| 2003/0060037 A1* | 3/2003 | Wu | 438/637 |
| 2003/0077896 A1* | 4/2003 | Saito et al. | 438/622 |
| 2005/0095838 A1* | 5/2005 | Jeong et al. | 438/622 |
| 2006/0003577 A1* | 1/2006 | Sone | 438/638 |
| 2006/0046456 A1* | 3/2006 | An | 438/597 |
| 2006/0263985 A1* | 11/2006 | Kang et al. | 438/275 |
| 2007/0099360 A1* | 5/2007 | Lee et al. | 438/197 |
| 2007/0099414 A1* | 5/2007 | Frohberg et al. | 438/618 |
| 2007/0117372 A1* | 5/2007 | Hsu et al. | 438/622 |
| 2007/0176798 A1* | 8/2007 | Kim | 341/11 |
| 2007/0257323 A1* | 11/2007 | Tsui et al. | 257/382 |
| 2008/0020582 A1 | 1/2008 | Bai | |
| 2008/0277736 A1* | 11/2008 | Nakajima | 257/377 |
| 2008/0305595 A1* | 12/2008 | Kwon | 438/279 |
| 2009/0140431 A1* | 6/2009 | Feustel et al. | 257/758 |
| 2009/0159978 A1* | 6/2009 | Matsubara et al. | 257/368 |
| 2010/0006932 A1* | 1/2010 | Matsubara | 257/334 |
| 2010/0308380 A1* | 12/2010 | Rothwell et al. | 257/288 |
| 2011/0049719 A1* | 3/2011 | Oda et al. | 257/758 |
| 2011/0139750 A1* | 6/2011 | Lee et al. | 216/67 |
| 2011/0263113 A1* | 10/2011 | Matsubara et al. | 438/585 |
| 2013/0021060 A1* | 1/2013 | Or-Bach | 326/41 |

OTHER PUBLICATIONS

Packan, P. et al. "High Performance 32nm Logic Technology Featuring 2nd Generation High-k + Metal Gate Transistor," Electron Devices Meeting (IEDM), 2009 IEEE International; Dec. 7-9, 2009. pp. 28.4.1-28.4.4.

German Office Action issued Mar. 1, 2012 in Application No. 10 2011 085 203.4.

Korean Intellectual Property Office, Office Action for Korean Patent Application No. 10-2011-0123809, mailed Jan. 30, 2013.

Korean Intellectual Property Office, Amendment to Office Action for Korean Patent Application No. 10-2011-0123809, mailed May 31, 2013.

Korean Intellectual Property Office, Arguments to Office Action for Korean Patent Application No. 10-2011-0123809, mailed May 31, 2013.

State Intellectual Property Office of the Peoples' Republic of China, Office Action for Chinese Patent Application No. 201110309959.X, mailed Nov. 19, 2013.

State Intellectual Property Office of the Peoples' Republic of China, Rejection Decision for Chinese Patent Application No. 201110309959.X, mailed Jun. 30, 2014.

\* cited by examiner

SEMICONDUCTOR DEVICES HAVING THROUGH-CONTACTS AND RELATED FABRICATION METHODS

TECHNICAL FIELD

Embodiments of the subject matter generally relate to semiconductor device structures and related fabrication methods, and more particularly, relate to devices and related fabrication methods for forming through-contacts between an overlying metal interconnect layer and devices structures formed on an underlying semiconductor substrate.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry. As the size and spacing of the transistors decrease, the dimension constraints for the electrical contacts between the transistors and the interconnecting metal layers also decrease. As a result, it is more difficult to accurately and repeatably form low resistance electrical contacts.

BRIEF SUMMARY

A method is provided for fabricating a semiconductor device structure. The method involves the steps of forming a first layer of dielectric material overlying a doped region formed in a semiconductor substrate adjacent to a gate structure, and forming a conductive contact that overlies and electrically connects to the doped region in the first layer of dielectric material. The method continues by forming a second layer of dielectric material overlying the gate structure, the conductive contact, and the first layer of dielectric material, forming a first voided region in the second layer overlying the conductive contact, forming a third layer of dielectric material overlying the second layer, and forming a second voided region in the third layer. At least a portion of the second voided region overlies at least a portion of the first voided region. The method continues by forming a conductive material in the second voided region that also fills the first voided region to contact the conductive contact.

In another embodiment, a method is provided for fabricating a device that includes a gate structure overlying a semiconductor substrate and a doped region formed in the semiconductor substrate adjacent to the gate structure. The method involves the steps of forming a first layer of dielectric material overlying the gate structure and the doped region, forming a first voided region in the first layer of dielectric material overlying the doped region, and forming a first conductive material in the first voided region, wherein the first conductive material formed in the first voided region electrically connects to the doped region. The method continues by forming a second layer of dielectric material overlying the gate structure, the first conductive material formed in the first voided region, and the first layer of dielectric material, forming a second voided region in the second layer overlying the first conductive material formed in the first voided region, forming a metal interconnect layer overlying the second layer, and forming a second conductive material in the second voided region to provide an electrical connection between the metal interconnect layer and the doped region via the first conductive material formed in the first voided region.

In another embodiment, an apparatus for a semiconductor device is provided. The device includes a semiconductor substrate, a gate structure overlying the semiconductor substrate, a doped region formed in the semiconductor substrate proximate the gate structure, and a conductive contact overlying the doped region. The conductive contact has a height substantially equal to a height of the gate structure. A first dielectric material is disposed between the conductive contact and the gate structure. A second dielectric material overlies the first dielectric material and the gate structure, and a metal interconnect layer overlies the second dielectric material. The metal interconnect layer includes a conductive metal material, wherein at least a portion of the conductive metal material is formed within the second dielectric material overlying the conductive contact to contact the conductive contact and create an electrical connection between the metal interconnect layer and the doped region.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

FIGS. 1-8 illustrate a device structure 100 and related process steps for fabricating the device structure 100 with conductive electrical contacts (also referred to herein as through-contacts) between a semiconductor device, such as a transistor, and an adjacent metal interconnect layer (e.g., Metal Layer 1 or Metal 1). Various steps in the fabrication of semiconductor devices are well known and so, in the interest of brevity, many conventional steps will only be mentioned briefly herein or will be omitted entirely without providing the well known process details.

Figure 1:
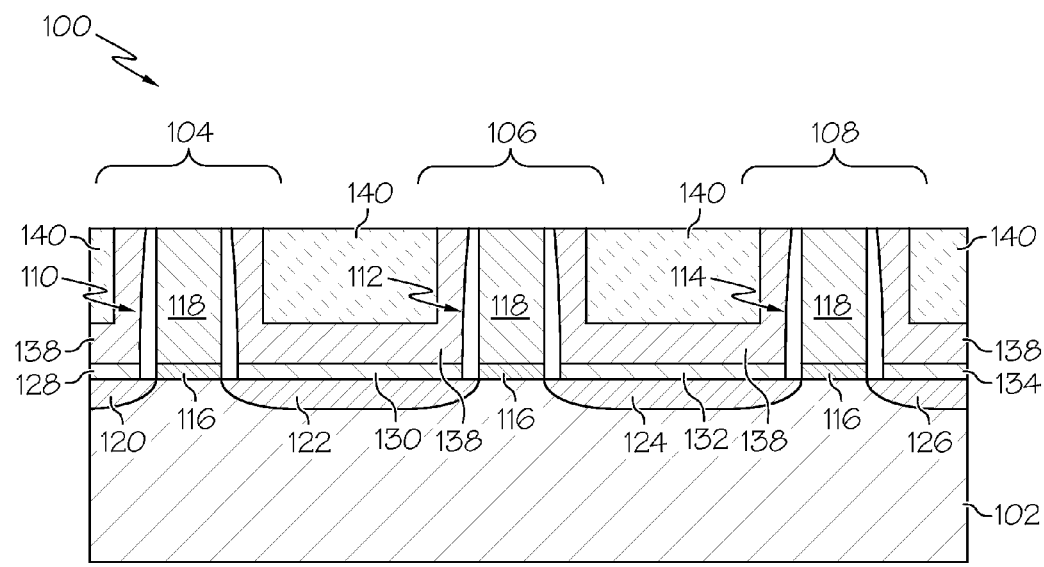
FIGS. 1-8 are cross-sectional views that illustrate a device structure and methods for fabricating the device structure in exemplary embodiments.

Referring now to FIG. 1, the through-contact fabrication process begins after front end of line (FEOL) processing steps are performed to fabricate one or more semiconductor device structures on a substrate 102 comprised of a semiconductive material, such as a silicon-comprising material, in a conventional manner. For example, the FEOL process steps may be formed to fabricate a plurality of transistor structures 104, 106, 108 on the semiconductor substrate 102 In the illustrated embodiment, each transistor structure 104, 106, 108 includes a gate structure 110, 112, 114 overlying the semiconductor substrate 102 that functions as a gate electrode for the respective transistor structure 104, 106, 108. The gate structures 110, 112, 114 can be created using a conventional gate stack module or any combination of well-known process steps. In practice, each gate structure 110, 112, 114 typically includes at least one layer of dielectric material 116 overlying the semiconductor substrate 102, and at least one layer of conductive material 118 overlying the dielectric material 116. It should be understood that various numbers, combinations and/or arrangements of materials may be utilized for the gate structures in a practical embodiment, and the subject matter described herein is not limited to any particular number, combination, or arrangement of gate material(s) in the gate structure. Additionally, the subject matter is not intended to be limited to any particular number of gate structures. In the illustrated embodiment, each transistor structure 104, 106, 108 also includes spaced-apart doped regions 120, 122, 124, 126 formed in the semiconductor substrate 102 adjacent to its respective gate structure 110, 112, 114. In an exemplary embodiment, the doped regions 120, 122, 124, 126 function as source/drain regions for the respective transistor structures 104, 106, 108, and accordingly, for convenience, but without limitation, the doped regions 120, 122, 124, 126 are alternately referred to herein as source/drain regions. It should be appreciated that although FIG. 1 depicts the source/drain regions as being integrally formed with or otherwise contiguous with source/drain regions of adjacent transistor structures for purposes of illustration, the subject matter is not intended to be limited to any particular arrangement of the source/drain regions. In an exemplary embodiment, the source/drain regions 120, 122, 124, 126 include contact regions 128, 130, 132, 134 formed on their upper surface to facilitate forming electrical connections between the source/drain regions 120, 122, 124, 126 of the transistor structures 104, 106, 108 and an adjacent metal interconnect layer, as described in greater detail below. The contact regions 128, 130, 132, 134, may be realized as a metal silicide layer formed on exposed upper surfaces of the source/drain regions 120, 122, 124, 126 in a conventional manner. Although not illustrated, in some embodiments, contact regions may also be formed on the upper surfaces of the conductive gate material 118, as will be appreciated in the art.

Still referring to FIG. 1, in an exemplary embodiment, the through-contact fabrication process begins by forming a first layer of a dielectric material 138 overlying the transistor structures 104, 106, 108, and forming a second layer of dielectric material 140 overlying the first layer of dielectric material 138, resulting in the device structure 100 of FIG. 1. In an exemplary embodiment, the first layer of dielectric material 138 is realized as a layer of a nitride material, such as silicon nitride, that is conformably deposited overlying the transistor structures 104, 106, 108 to a thickness ranging from about 10 nanometers (nm) to about 50 nm, for example, by chemical vapor deposition (CVD) at a temperature less than about 500° C. In an exemplary embodiment, the second layer of dielectric material 140 is realized as a layer of an oxide material, such as silicon dioxide, that is conformably deposited overlying the layer of nitride material 138 to a thickness chosen such that the oxide material 140 fills any gaps between the gate structures 110, 112, 114 to a minimum height that meets or exceeds the height of the gate structures 110, 112, 114, or in other words, the thickness of the oxide material 138 is greater than or equal to the difference between the height of the gate structures 110, 112, 114 and the thickness of the layer of nitride material 138. For example, a layer of silicon dioxide be formed by CVD or atomic layer deposition (ALD) at a temperature that is less than about 500° C. until the gaps between the gate structures 110, 112, 114 are completely filled to a height above the gate structures 110, 112, 114. As described in greater detail below, the nitride layer 138 functions as an etch stop layer when etching the oxide material 140 to form voided regions (or holes) for forming local contacts to the source/drain regions 120, 122, 124, 126.

After forming the dielectric layers 138, 140, in the illustrated embodiment, the through-contact fabrication process continues by removing portions of the dielectric layers 138, 140 to obtain a substantially planar surface 142 that is aligned with the upper surface of the gate structures 110, 112, 114, resulting in the device structure 100 illustrated by FIG. 1. In an exemplary embodiment, the fabrication process planarizes the dielectric layers 138, 140 to uniformly remove portions of the dielectric layers 138, 140 across the semiconductor substrate 102 until reaching the conductive gate material 118 of the gate structures 110, 112, 114. In other words, the through-contact fabrication process ceases planarizing the dielectric layers 138, 140 when the upper surfaces of the gate structures 110, 112, 114 are exposed. In accordance with one embodiment, chemical-mechanical planarization (CMP) is used to polish the dielectric layers 138, 140 with a chemical slurry for a predetermined amount of time based on the thicknesses of the dielectric layers 138, 140 such that the CMP stops when the upper surfaces of the gate structures 110, 112, 114 are exposed. Alternative endpoint detection techniques could also be utilized to determine when to stop the CMP procedure, or alternative planarization techniques may be used to obtain the substantially planar surface 142 that is aligned with the upper surfaces of the gate structures 110, 112, 114.

Figure 2:
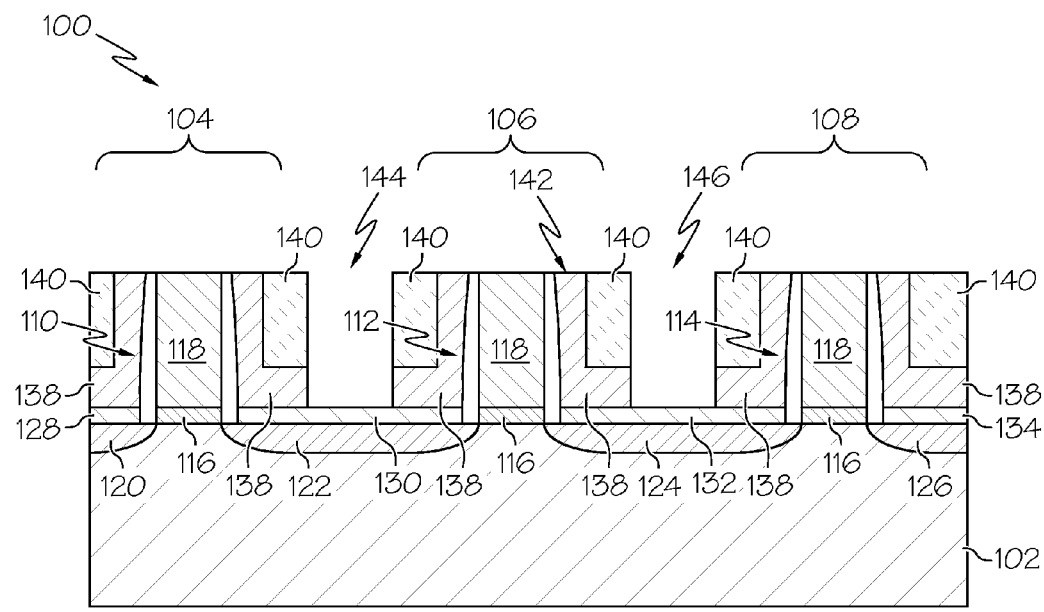

Referring now to FIG. 2, in an exemplary embodiment, after the planarization step, the through-contact fabrication process continues by selectively removing portions of the dielectric materials 138, 140 to create voided regions 144, 146 (or holes) within the dielectric materials 138, 140. The voided regions 144, 146 define the lateral dimensions of local contacts subsequently formed therein, as described in the context of FIG. 3. In an exemplary embodiment, the through contact fabrication process forms a layer of masking material (e.g., a photoresist material, a nitride material, or the like) overlying the planar surface 142, and portions of the masking material are selectively removed (e.g., using photolithography or a suitable etchant chemistry) to define a mask that exposes portions of the dielectric materials 138, 140 overlying the source/drain regions 122, 124 that will subsequently be removed to create the voided regions 144, 146 while leaving the portions of the masking material overlying the gate structures 110, 112, 114 intact. In an exemplary embodiment, portions of the dielectric material 138, 140 adjacent to the gate structures 110, 112, 114 are protected by the masking material to electrically isolate subsequently formed local contacts from adjacent gate structures 110, 112, 114.

After patterning the masking material, the through-contact fabrication process continues by selectively removing portions of the dielectric layers 138, 140 using the patterned masking material as an etch mask. In an exemplary embodiment, the exposed portions of the dielectric material 140 are removed using an anisotropic (or directional) etch process that stops on the layer of dielectric material 138. For example, exposed portions of silicon dioxide (e.g., dielectric material 140) may be anisotropically etched by plasma-based reactive ion etching (RIE) using an anisotropic etchant chemistry, such as fluorocarbon-based plasma chemistry that is selective to nitride material (e.g., dielectric material 138). The remaining masking material prevents the anisotropic etching process from removing portions of the dielectric material 140 underlying the masking material while the exposed portions of the dielectric material 140 are removed. In an exemplary embodiment, the dielectric material 140 is etched until the underlying dielectric material 138 is exposed. In this regard, the etchant chemistry or etch conditions used to etch dielectric material 140 does not etch the underlying dielectric material 138 at the same rate, such that the underlying dielectric material 138 acts as an etch stop. In one embodiment, after removing exposed portions of dielectric material 140, the exposed portions of the dielectric material 138 are removed using an anisotropic etchant until the contact regions 130, 132 are exposed by voided regions 144, 146. The masking material is preferably resistant to the anisotropic etchant chemistries and/or has a thickness such that the upper surfaces of the underlying dielectric materials 138, 140 and/or conductive material 118 are not exposed during the etch process steps. After removing exposed portions of the dielectric material 138 to form the voided regions 144, 146, the fabrication process continues by removing any remaining masking material in a conventional manner, resulting in the device structure 100 of FIG. 2. It should be appreciated that in alternate embodiments, the dielectric materials 138, 140 may removed using a single etchant as part of a single etch process step. In an exemplary embodiment, the voided regions 144, 146 are separated from adjacent gate structures 110, 112, 114 by a distance of about 10 nm by the remaining dielectric material 138, 140 to electrically isolate subsequently formed local contacts from adjacent gate structures 110, 112, 114.

Figure 3:
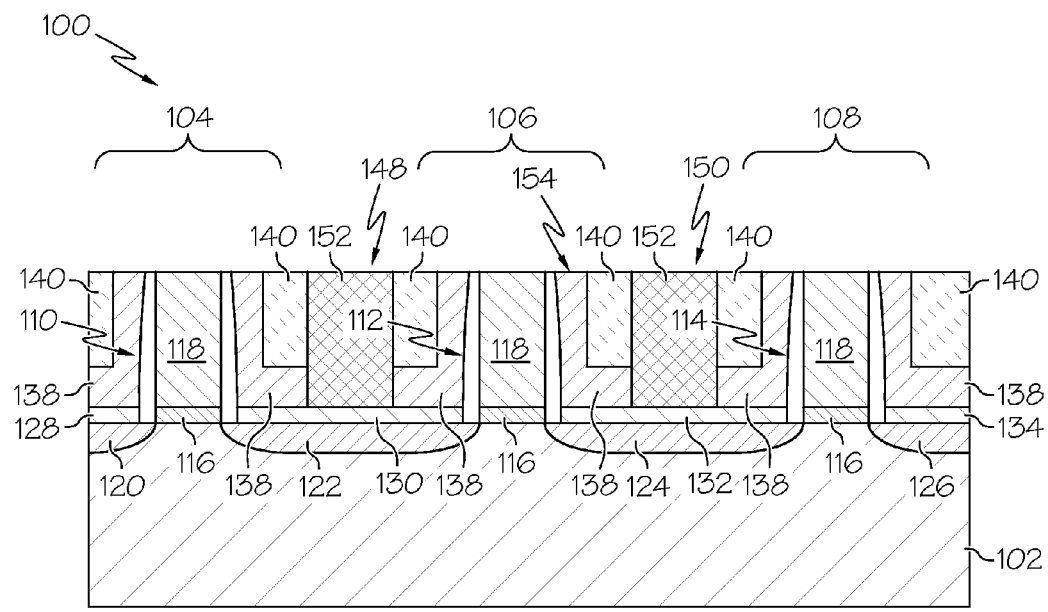

Referring now to FIG. 3, after creating voided regions 144, 146, the through-contact fabrication continues by forming local contacts 148, 150 in the voided regions 144, 146. In this regard, the local contacts 148, 150 are realized as a conductive material 152 that provides an electrical connection to the contact regions 130, 132 and source/drain regions 122, 124. The local contacts 148, 150 are preferably formed by conformably depositing a conductive material 152, such as a tungsten material, overlying the semiconductor substrate 102 to a thickness chosen such that the conductive material 152 fills the voided regions 144, 146 to a minimum height that meets or exceeds the height of the gate structures 110, 112, 114 (e.g., a "flush" fill or overfill). In an exemplary embodiment, the local contacts 148, 150 are formed by conformably depositing tungsten by CVD or ALD at a temperature less than about 500° C. to a thickness that is substantially equal to or slightly greater than the height of the gate structures 110, 112, 114. In this regard, a tungsten material is capable of completely filling the voided regions 144, 146 without diffusing to the semiconductor substrate 102 and/or contact regions 130, 132. After forming the layer of conductive material 152, the through-contact fabrication process continues by planarizing the device structure 100 to remove portions of the conductive material 152 that did not fill the voided regions 144, 146 to obtain a substantially planar surface 154 that is aligned with the upper surface of the gate structures 110, 112, 114. In this regard, the conductive material 152 is uniformly removed across the device structure 100 until reaching the conductive material 118 of the gate structures 110, 112, 114, for example, by performing CMP to polish the conductive material 152 with a chemical slurry and stopping when the upper surfaces of the gate structures 110, 112, 114 are exposed, in a similar manner as described above.

Figure 4:
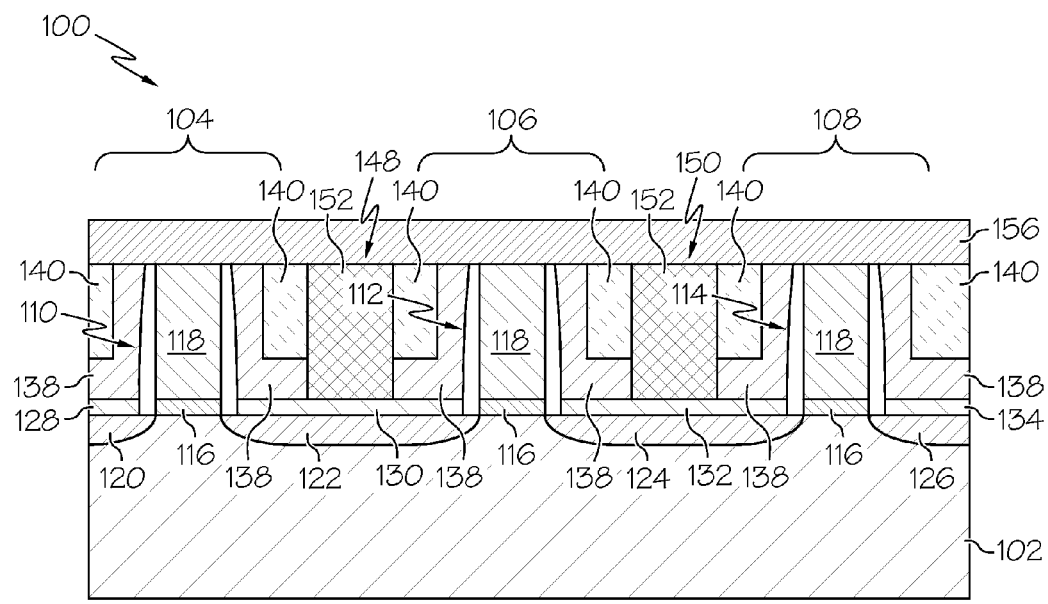

Referring now to FIG. 4, in an exemplary embodiment, after forming the local contacts 148, 150, the through-contact fabrication process continues by forming a layer of dielectric material 156 overlying the local contacts 148, 150. In an exemplary embodiment, the layer of dielectric material 156 is realized as a layer of a nitride material, such as silicon nitride, that is conformably deposited overlying the semiconductor substrate 102 to a thickness that is less than about 50 nm, for example, by CVD at a temperature below 500° C.

Figure 5:
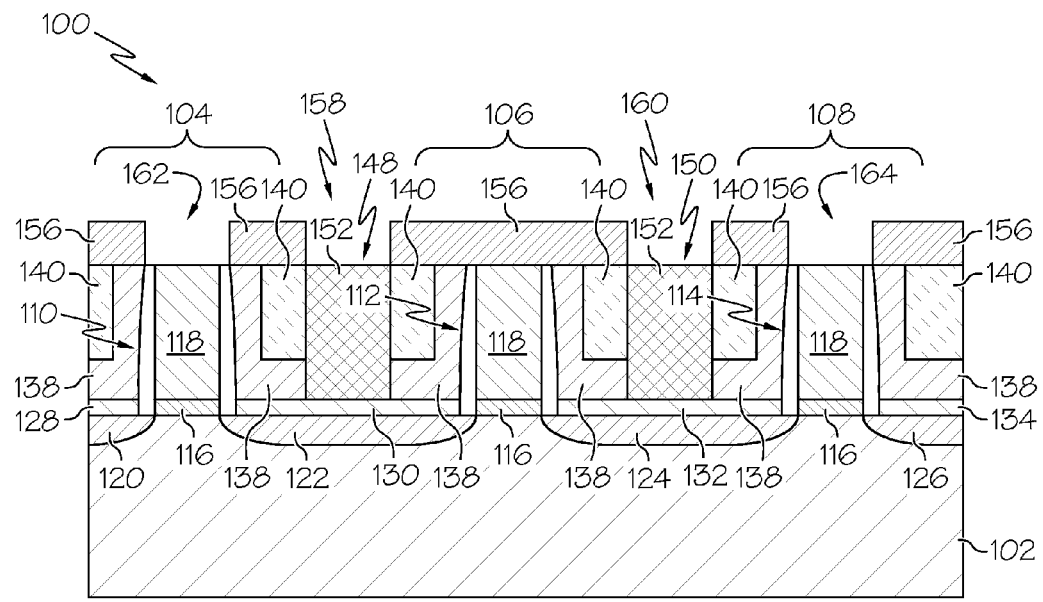

Referring now to FIG. 5, in an exemplary embodiment, after forming the layer of dielectric material 156, the through-contact fabrication process continues by selectively removing portions of the dielectric material 156 to create voided regions 158, 160 (or holes) within the layer of dielectric material 156 that define the lateral dimensions of through-contacts subsequently formed in the voided regions 158, 160. In this regard, voided regions 158, 160 are formed such that at least a portion of the voided regions 158, 160 overlaps or otherwise overlies the local contacts 148, 150. Preferably, the voided regions 158, 160 are vertically aligned with or otherwise centered with respect to the local contacts 148, 150. As described above, the voided regions 158, 160 may be formed by forming a layer of masking material (e.g., a photoresist material, a hard mask material, or the like) overlying the dielectric material 156, selectively removing portions of the masking material (e.g., using photolithography or a suitable etchant chemistry) to define a mask that exposes portions of the dielectric material 156 overlying the local contacts 148, 150, and selectively removing the exposed portions of the dielectric material 156 using an anisotropic etchant chemistry to expose the local contacts 148, 150. In an exemplary embodiment, the masking material is also patterned to expose portions of the dielectric material 156 overlying the gate structures 110, 114 before etching the dielectric material 156 to allow voided regions 162, 164 overlying the gate structures 110, 114 to be formed concurrently to voided regions 158, 160 (e.g., at the same time as part of the same etch step). After creating voided regions 158, 160, 162, 164, any remaining masking material may be removed in a conventional manner, resulting in the device structure 100 of FIG. 5.

As described in greater detail below in the context of FIG. 8, the voided regions 158, 160, 162, 164 define the horizontal (or lateral) dimensions of subsequently formed through-contacts that provide electrical interconnections between the local contacts 148, 150 and/or gate structures 110, 114 and an overlying metal layer. In an exemplary embodiment, the aspect ratio of the voided regions 158, 160, 162, 164, that is, the ratio of the vertical dimension (or height) of the voided regions 158, 160, 162, 164 to the horizontal (or lateral) dimension of the voided regions 158, 160, 162, 164, is less than or equal to one to provide improved control over the critical dimension of the voided regions 158, 160, 162, 164 (i.e., largest horizontal or lateral dimension of the voided regions 158, 160, 162, 164) while etching the dielectric material 156 with reduced etch time. In this regard, in accordance with one or more embodiments, the critical dimension of the voided regions 158, 160 is greater than the thickness of the dielectric material 156 (e.g., greater than 50 nm). As a result of the aspect ratio for the voided regions 158, 160, 162, 164 being less than or equal to one (e.g., by virtue of the relative thinness of the dielectric material 156), the voided regions 158, 160, 162, 164 are relatively easier to subsequently fill, and accordingly, may be filled by conductive metal materials, such as copper, to provide a relatively low resistance electrical connection between the overlying metal layer and the local contacts 148, 150 and/or gate structures 110, 114.

Figure 6:
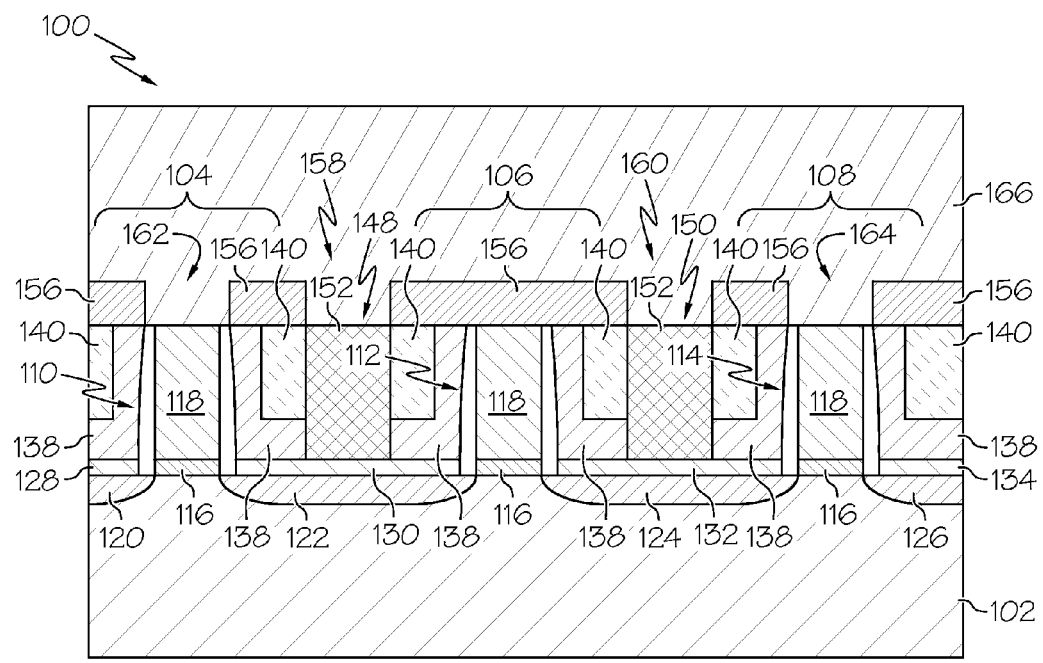
Figure 7:
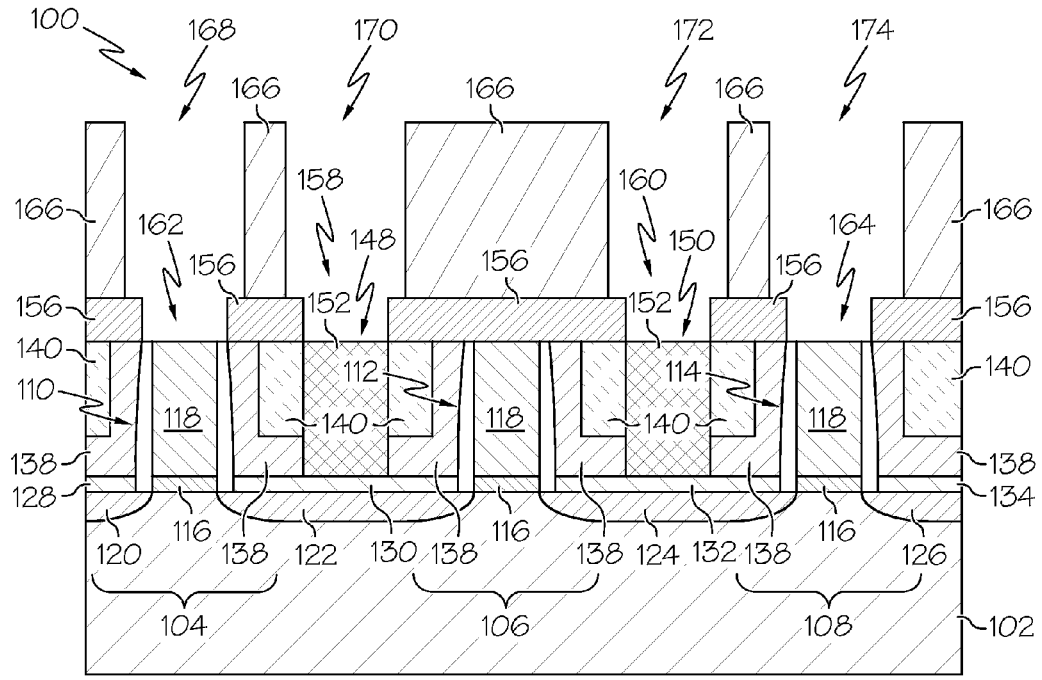
Figure 8:
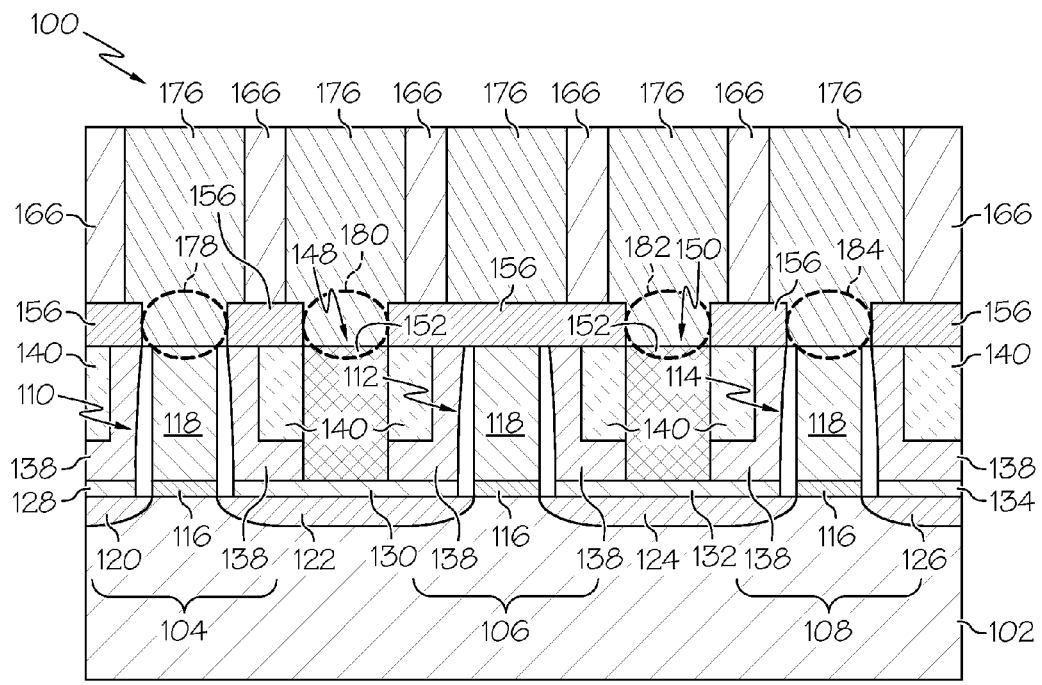

Referring now to FIGS. 6-8, in an exemplary embodiment, after forming voided regions 158, 160, 162, 164 in the dielectric material 156, the through-contact fabrication process continues by forming a metal interconnect layer overlying the semiconductor substrate 102. In this regard, the metal interconnect layer is realized as the first metal layer (e.g., Metal 1) that is nearest or otherwise adjacent to the semiconductor devices 104, 106, 108 formed on the semiconductor substrate 102. In an exemplary embodiment, the through-contact fabrication process forms the metal interconnect layer by conformably depositing a layer of a dielectric material 166, such as silicon dioxide or another suitable oxide material, overlying the device structure 100 of FIG. 5, resulting in the device structure 100 illustrated by FIG. 6. In this regard, the layer of dielectric material 166 functions as the intralayer dielectric for the metal interconnect layer. In an exemplary embodiment, the dielectric material 166 is conformably deposited overlying the semiconductor substrate 102 to a thickness that is greater than about 100 nm, for example, by CVD at a temperature at or below 400° C.

Referring now to FIG. 7, after forming the dielectric material 166, the through-contact fabrication process continues by selectively removing portions of the dielectric material 166 to create voided trench regions 168, 170, 172, 174 corresponding to the pattern, routing and/or interlayer interconnections to be provided by the metal interconnect layer (e.g., Metal 1) in a conventional manner. For example, a layer of a masking material (e.g., a photoresist material, a nitride material, or the like) may be formed overlying the dielectric material 166, and portions of the masking material may be subsequently removed (e.g., using photolithography or a suitable etchant chemistry) to define the pattern for the metal of the metal interconnect layer. In an exemplary embodiment, the mask exposes at least a portion of the dielectric material 166 overlying the local contacts 148, 150 and gate structures 110, 114, such that at least a portion of the subsequently formed trench regions 168, 170, 172, 174 overlie or overlap the voided regions 158, 160, 162, 164 to provide a conduit for the metal of the metal interconnect layer to contact the local contacts 148, 150 and gate structures 110, 114. After patterning the masking material to create the etch mask, the exposed portions of the dielectric material 166 are selectively removed using an anisotropic etchant to remove the exposed portions of the dielectric material 166 until surfaces of the local contacts 148, 150 and gate structures 110, 114 are exposed, as illustrated in FIG. 7. After etching the dielectric material 166 to provide the voided trench regions 168, 170, 172, 174 corresponding to the desired pattern for the metal interconnect layer, any remaining masking material may be removed in a conventional manner.

Referring now to FIG. 8, after patterning the dielectric material 166, the through-contact fabrication process continues fabrication of the metal interconnect layer (e.g., Metal 1) by forming a conductive metal material in the trench regions 168, 170, 172, 174. In an exemplary embodiment, the metal layer is formed by conformably depositing a conductive metal material 176, such as a copper material, overlying the semiconductor substrate 102 to a thickness chosen such that the conductive metal material 176 fills the trench regions 168, 170, 172, 174 to a minimum height that meets or exceeds the height of the intralayer dielectric layer 166 (e.g., a "flush" fill or slight overfill). In accordance with one or more embodiments, the conductive metal material 176 is realized as copper deposited by plating the semiconductor substrate 102 at a temperature at or below 200° C. to a thickness substantially equal to (or slightly greater than) the thickness of the dielectric material 166. As illustrated in FIG. 8, by virtue of the relatively low aspect ratio for the voided regions 158, 160, 162, 164 in the layer of dielectric material 156, the conductive metal material 176 for the Metal 1 layer is capable of completely filling the voided regions 158, 160, 162, 164 while concurrently filling the trench regions 168, 170, 172, 174 as part of the same process step to provide through-contacts 178, 180, 182, 184 between the Metal 1 layer and the local contacts 148, 150 and gate structures 110, 114. In this regard, as used herein, a through-contact should be understood as referring to the portion of the conductive metal material 176 that is disposed within or otherwise fills a respective voided region 158, 160, 162, 164 to provide an electrical interconnect to the metal interconnect layer. In this manner, the through-contacts 178, 180, 182, 184 are integral with the Metal 1 layer and provide a low resistance electrical connection between the conductive metal material 176 of the Metal 1 layer and the underlying local contacts 148, 150 and gate structures 110, 114.

After forming the conductive metal material 176, the through-contact fabrication process may continue by performing well known back end of line (BEOL) process steps to complete fabrication of the semiconductor device structure in a conventional manner. For example, the through-contact fabrication process may proceed by planarizing the metal interconnect layer (e.g., by removing portions of the conductive metal material 176 and/or dielectric material 166 to obtain a substantially planar surface, forming an interlayer dielectric overlying the metal interconnect layer, forming vias in the interlayer dielectric, forming another metal interconnect layer overlying the interlayer dielectric, and repeating these steps until all of the necessary metal interconnect layers have been formed.

Figure 9:
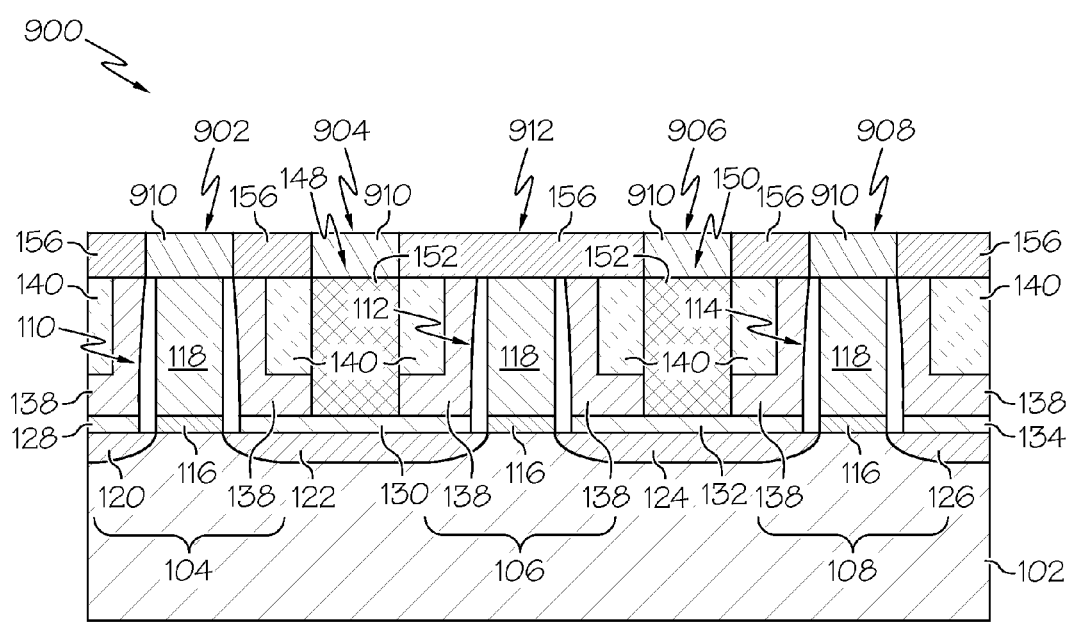
FIG. 9 is a cross-sectional view that illustrates a device structure and related methods for fabricating the device structure in accordance with one embodiment.

FIG. 9 illustrates a device structure 900 formed in accordance with an alternate embodiment of the through-contact fabrication process described above. In the alternate embodiment, through-contacts 902, 904, 906, 908 are formed in the voided regions 158, 160, 162, 164 after the step of forming the voided regions 158, 160, 162, 164 described above in the context of FIG. 5 and prior to forming the metal interconnect layer as described in the context of FIGS. 6-8. In the illustrated embodiment, the through-contacts 902, 904, 906, 908 are formed by conformably depositing a conductive material 910 overlying the semiconductor substrate 102 to a thickness chosen such that the conductive material 910 (e.g., copper, tungsten, cobalt, or another suitable metal material) fills the voided regions 158, 160, 162, 164 to a minimum height that meets or exceeds the thickness of the layer of dielectric material 156 (e.g., a "flush" fill or overfill). After forming the layer of conductive material 910, the through-contact fabrication process continues by removing portions of the conductive material 910 to obtain a substantially planar surface 912. In this regard, the conductive material 910 is uniformly removed across the semiconductor substrate 102 until reaching the dielectric material 156, for example, by performing CMP to polish the conductive material 910 with a chemical slurry and stopping when the upper surface of the dielectric material 156 is exposed, in a similar manner as described above. After removing the excess conductive material 910, the alternate embodiment of the through-contact fabrication process continues by forming the overlying metal interconnect layer as described in the context of FIGS. 6-8.

To briefly summarize, one advantage of the fabrication processes and semiconductor device structures described herein is that low resistance through-contacts may be provided between transistors or other semiconductor devices formed on a semiconductor substrate and the overlying metal interconnect layer using the standard metallization process steps and without having to perform additional deposition and planarization steps. For example, by virtue of their relatively low aspect ratio, the through-contacts may be formed from metal as part of the same metal deposition step used to fabricate the metal of the Metal 1 layer. Additionally, because the aspect ratio of the through-contacts is relatively low, the resistance of the through-contacts is relatively low and the through-contacts may be formed with quadratic (or circular) shape, rectangular (or elliptical) shape, or another suitable geometric shape.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a device, the method comprising
providing a semiconductor substrate with a selected gate structure, a non-selected gate structure, and a doped region formed in the semiconductor substrate aligned with sidewalls of the gate structures, wherein the selected gate structure has a gate width;
forming a first dielectric layer overlying the doped region and the gate structures;
forming a conductive contact in the first dielectric layer and electrically connected to the doped region, wherein the conductive contact has a contact width;
forming a second dielectric layer on the gate structures, the conductive contact, and the first dielectric layer;
creating an intermediate structure exposing the conductive contact and a selected gate structure by simultaneously etching a contact opening and a gate opening in the second dielectric layer; wherein the contact opening exposes the conductive contact, has an aspect ratio of equal to or less than one, and has a contact opening width substantially equal to the contact width; and wherein the gate opening exposes the selected gate structure, has an aspect ratio of equal to or less than one, and has a gate opening width substantially equal to the gate width;
forming a third dielectric layer on the second dielectric layer, on the conductive contact in the contact opening, and on the selected gate structure in the gate opening;
forming a contact void in the third dielectric layer overlying the contact opening and a gate void in the third dielectric layer overlying the gate opening and removing the third dielectric layer from the contact opening and from the gate opening; and
forming a metal interconnect layer on the third dielectric layer, wherein the metal interconnect layer fills the contact void and the contact opening to contact the conductive contact and fills the gate void and the gate opening to contact the selected gate structure, wherein a non-selected gate structure is insulated from the metal interconnect layer by the second dielectric layer.

2. The method of claim 1 further comprising forming an etch stop layer overlying the doped region, wherein forming a first dielectric layer overlying the doped region comprises forming the first dielectric layer overlying the etch stop layer, and wherein forming the conductive contact comprises forming the conductive contact through the etch stop layer and through the first dielectric layer.

3. The method of claim 1 wherein forming the contact void in the third dielectric layer overlying the contact opening and the gate void in the third dielectric layer overlying the gate opening comprises forming the contact void with a contact void width greater than the contact opening width and forming the gate void with a gate void width greater than the gate opening width.

4. The method of claim 1 wherein:
the conductive contact has vertical sidewalls, and
creating the intermediate structure exposing the conductive contact and the selected gate structure comprises forming the contact opening with vertical sides aligned with the vertical sidewalls of the conductive contact.

5. The method of claim 4 wherein:
the selected gate structure has an upper surface that terminates at two edges; and
creating an intermediate structure exposing the conductive contact and a selected gate structure comprises forming the gate opening with gate opening sides aligned with the two edges of the upper surface of the selected gate structure.

6. The method of claim 5 wherein forming the contact void in the third dielectric layer overlying the contact opening and the gate void in the third dielectric layer overlying the gate opening comprises forming the contact void with a contact void width greater than the contact opening width and forming the gate void with a gate void width greater than the gate opening width.

7. The method of claim 1 wherein:
forming the third dielectric layer comprises depositing an intralayer dielectric for a first metal interconnect layer; and
forming the metal interconnect layer comprises depositing a conductive metal material.

8. The method of claim 1 wherein forming the conductive contact comprises:
removing a portion of the first dielectric layer overlying the doped region to form a contact hole; and
forming a second conductive material in the contact hole.

9. The method of claim 8 further comprising forming a contact region on the doped region prior to forming the first dielectric layer, the contact region being exposed by the contact hole.

10. The method of claim 8 further comprising planarizing the second conductive material to obtain a planar surface aligned with the gate structures before forming the second dielectric layer, wherein planarizing the second conductive material results in a height of the conductive contact being substantially equally to a height of the gate structures.

11. The method of claim 10 wherein:
forming the second dielectric layer comprises conformably depositing a nitride material overlying the planar surface; and
forming the third dielectric layer comprises conformably depositing a layer of oxide material overlying the nitride material after creating the intermediate structure.

12. A method of fabricating a device including a gate structure overlying a semiconductor substrate and a doped region formed in the semiconductor substrate aligned with sidewalls of the gate structure and an additional gate structure, the method comprising:
forming an etch stop layer on the gate structure and the semiconductor substrate;
forming a first dielectric layer on the etch stop layer;

planarizing the etch stop layer and the first dielectric layer to a surface exposing the gate structure;

etching a portion of the dielectric material and stopping on the etch stop layer to expose a portion of the etch stop layer, and etching the exposed portion of the etch stop layer to form a contact hole in the first dielectric layer and the etch stop layer overlying the doped region;

forming a local contact with a first conductive material in the contact hole and electrically connected to the doped region;

forming a second dielectric layer overlying the gate structure, the local contact, and the first dielectric layer;

creating an intermediate structure exposing the gate structure and the local contact by concurrently forming a gate opening in the second dielectric layer overlying the gate structure and a contact opening in the second dielectric layer overlying and vertically aligned with the local contact, wherein the contact opening has an aspect ratio of equal to or less than one, and wherein the gate opening has an aspect ratio of equal to or less than one;

forming a third dielectric layer over the intermediate structure and on the second dielectric layer, on the local contact in the contact opening, and on the selected gate structure in the gate opening;

forming a gate void in the third dielectric layer overlying the gate opening, and forming a contact void in the third dielectric layer overlying the contact opening by removing the third dielectric layer from the gate opening and from the contact opening; and forming a metal interconnect layer on the third dielectric layer, wherein the metal interconnect layer fills the gate void and gate opening to contact the gate structure and fills the contact void and the contact opening to contact the local contact.

13. The method of claim 12 wherein forming the contact opening comprises forming the contact opening vertically aligned with the local contact.

14. The method of claim 12 wherein the gate structure has an upper surface that terminates at two edges, wherein concurrently forming the gate opening and the contact opening comprises forming the gate opening having sidewalls aligned with the two edges of the upper surface of the gate structure, and wherein forming a contact void comprises forming the contact void with void sidewalls non-aligned with the two edges of the upper surface of the gate structure.

15. The method of claim 12 wherein the local contact has vertical sidewalls, wherein forming the contact opening comprises forming the contact opening with vertical sides aligned with the vertical sidewalls of the local contact.

16. The method of claim 12 further comprising planarizing the first dielectric layer to obtain a planar surface aligned with the gate structure prior to forming the contact hole.

17. The method of claim 16 wherein forming the local contact comprises:
conformably depositing the first conductive material overlying the planar surface; and
planarizing the first conductive material to obtain a second planar surface aligned with the gate structure prior to forming the second dielectric layer.

18. The method of claim 17 wherein forming the second dielectric layer comprises conformably depositing the second dielectric layer overlying the second planar surface to a thickness of less than about 50 nm.

* * * * *